US012763572B2

(12) United States Patent
Fermelis et al.

(10) Patent No.: US 12,763,572 B2
(45) **Date of Patent: *Oct. 13, 2026**

(54) MODULAR DISTRIBUTION AND SIGNALING UNIT WITH OVER VOLTAGE PROTECTION FOR FIBER OPTIC AND POWER CABLES

(71) Applicant: RAYCAP IP ASSETS LTD, Nicosia (CY)

(72) Inventors: Elias Fermelis, Koropi (GR); Kostas Bakatsias, Gerakas (GR); Charis Coletti, Nea Erythrea (GR)

(73) Assignee: RAYCAP IP ASSETS LTD, Nicosia (CY)

( * ) Notice: Subject to any disclaimer, the term of this patent is extended or adjusted under 35 U.S.C. 154(b) by 0 days.

This patent is subject to a terminal disclaimer.

(21) Appl. No.: 18/991,175

(22) Filed: Dec. 20, 2024

(65) Prior Publication Data

US 2026/0031609 A1 Jan. 29, 2026

Related U.S. Application Data

(63) Continuation-in-part of application No. 18/295,778, filed on Apr. 4, 2023, now Pat. No. 12,444,927.

(51) Int. Cl.

| | |
|---|---|
| ***H02H 7/22*** | (2006.01) |
| ***G02B 6/44*** | (2006.01) |
| ***H02B 1/20*** | (2006.01) |
| ***H02H 1/04*** | (2006.01) |
| ***H05K 7/14*** | (2006.01) |
| ***H05K 7/18*** | (2006.01) |

(52) U.S. Cl.
CPC ........... *H02H 7/226* (2013.01); *G02B 6/4448* (2013.01); *H02B 1/202* (2013.01); *H02H 1/04* (2013.01); *H05K 7/1428* (2013.01); *H05K 7/186* (2013.01)

(58) Field of Classification Search
CPC .... G02B 6/4448; G02B 6/4472; H02B 1/202; H02H 1/04; H02H 7/226; H05K 7/1428; H05K 7/186
USPC .......................................................... 361/107
See application file for complete search history.

(56) References Cited

U.S. PATENT DOCUMENTS

| | | | | |
|---|---|---|---|---|
| 10,181,717 B2 | 1/2019 | Miller | | |
| 10,971,928 B2 | 4/2021 | Warner | | |
| 2014/0168842 A1* | 6/2014 | Martinez | H02H 9/04 | 361/91.1 |
| 2015/0155706 A1* | 6/2015 | Miller | H01T 4/06 | 361/118 |

(Continued)

FOREIGN PATENT DOCUMENTS

EP 3798706 A1 3/2021

*Primary Examiner* — Kevin J Comber
(74) *Attorney, Agent, or Firm* — Schwabe Williamson & Wyatt

(57) ABSTRACT

A distribution and signaling unit includes an enclosure configured to receive a trunk cable comprising power cables and fiber optic cables. Hybrid adaptors are arranged in an array and extend through one or more walls of the enclosure. A plurality of pluggable over voltage protection (OVP) modules are removably inserted into the enclosure. A pluggable printed circuit board assembly (PCBA) module is removably inserted into the enclosure. The PCBA module includes a processor configured to transmit alarm signals or voltage values measured from the power cables to a remote location.

22 Claims, 15 Drawing Sheets

(56) References Cited

U.S. PATENT DOCUMENTS

| | | | | |
|---|---|---|---|---|
| 2017/0141563 | A1* | 5/2017 | Islam | G02B 6/4416 |
| 2018/0115120 | A1 | 4/2018 | Islam | |
| 2020/0076187 | A1* | 3/2020 | Warner | G02B 6/44265 |
| 2021/0091481 | A1* | 3/2021 | Fermelis | G02B 6/44265 |
| 2021/0191481 | A1 | 6/2021 | Deng | |

* cited by examiner

50

MODULAR DISTRIBUTION AND SIGNALING UNIT WITH OVER VOLTAGE PROTECTION FOR FIBER OPTIC AND POWER CABLES

CROSS-REFERENCE TO RELATED APPLICATIONS

This application is a continuation-in-part of U.S. application Ser. No. 18/295,778, titled DISTRIBUTION AND SIGNALING UNIT WITH OVER VOLTAGE PROTECTION FOR FIBER OPTIC AND POWER CABLES, filed Apr. 4, 2023, which is hereby incorporated by reference in its entirety.

FIELD OF INVENTION

The present disclosure relates to distribution and signaling units for cellular tower installations, and more particularly to a modular distribution and signaling unit with pluggable overvoltage protection modules for fiber optic and power cables.

BACKGROUND

Cellular tower sites are increasingly distributed around the world to provide mobile communications for a variety of devices. These sites typically include radio units connected to antennas using radio frequency (RF) cabling, with the radio units supplied power by input power cables and return cables back to a power supply located in a shelter. Additionally, data is communicated between base station units and the radio units over fiber optic cabling.

In recent years, there has been a shift towards distributed antenna systems (DAS) and remote radio head (RRH) configurations, where radios are located next to the antennas on the tower outside of the communications shelter. This approach helps minimize energy loss in RF cable connections between base stations and antennas. However, it introduces new challenges in terms of power and data distribution to these tower-mounted units.

Conventional solutions for power and data distribution to tower-mounted radio units face several limitations. The space available for fiber optic breakout assemblies and other components is extremely limited on cellular towers, and this space is often costly for cellular operators to rent from tower owners. Existing distribution units are typically large and bulky, occupying significant tower space.

Furthermore, tower-mounted equipment is susceptible to damage from overvoltage and surge current, particularly during lightning strikes. Conventional overvoltage protection (OVP) solutions are often integrated into the distribution units in a fixed manner, making replacement or upgrade of individual OVP components challenging. This can lead to increased downtime and maintenance costs when OVP modules need to be serviced or replaced.

Another significant issue with existing distribution units is their limited flexibility in accommodating varying numbers of radio units and adapting to different tower configurations. Many current solutions provide a fixed number of connection points, which may not align with the specific needs of a given cellular site. This lack of scalability can result in either underutilized equipment or the need for multiple units, further exacerbating space constraints on the tower.

Moreover, conventional distribution units often lack integrated monitoring capabilities for detecting and reporting issues such as OVP failures, intrusions, or abnormal voltage conditions. This absence of real-time monitoring can lead to delayed response times for addressing potential problems, potentially resulting in extended service disruptions.

Given these challenges, there is a clear need for improved distribution and signaling units that address the space constraints, modularity requirements, overvoltage protection needs, and monitoring capabilities for modern cellular tower installations. Such improvements could significantly enhance the efficiency, reliability, and cost-effectiveness of cellular network infrastructure.

SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

The present disclosure provides a modular distribution and signaling unit for cellular tower installations that optimizes space utilization while enhancing functionality. The unit comprises an enclosure configured to receive a trunk cable containing power and fiber optic cables, with hybrid adaptors arranged in an array and extending through the enclosure walls. The unit features pluggable over voltage protection (OVP) modules and a pluggable printed circuit board assembly (PCBA) module, both removably inserted into the enclosure without tools. The PCBA module includes a processor for transmitting alarm signals and voltage measurements to a remote location, enhancing monitoring capabilities.

According to the disclosed embodiments, the modular design, coupled with bus bar integration and bullet connector coupling, allows for easy installation, maintenance, and customization of the unit's components. The foregoing general description of the illustrative embodiments and the following detailed description thereof are merely exemplary aspects of the teachings of this disclosure and are not restrictive.

BRIEF DESCRIPTION OF FIGURES

The included drawings are for illustrative purposes and serve to provide examples of possible structures and operations for the disclosed inventive systems, apparatus, methods and computer-readable storage media. These drawings in no way limit any changes in form and detail that may be made by one skilled in the art without departing from the spirit and scope of the disclosed implementations.

Non-limiting and non-exhaustive examples are described with reference to the following figures.

FIG. 2A and FIG. 2B illustrate angled and orthogonal views of a modular distribution signaling unit, respectively, in some cases.

DETAILED DESCRIPTION

Figure 1:
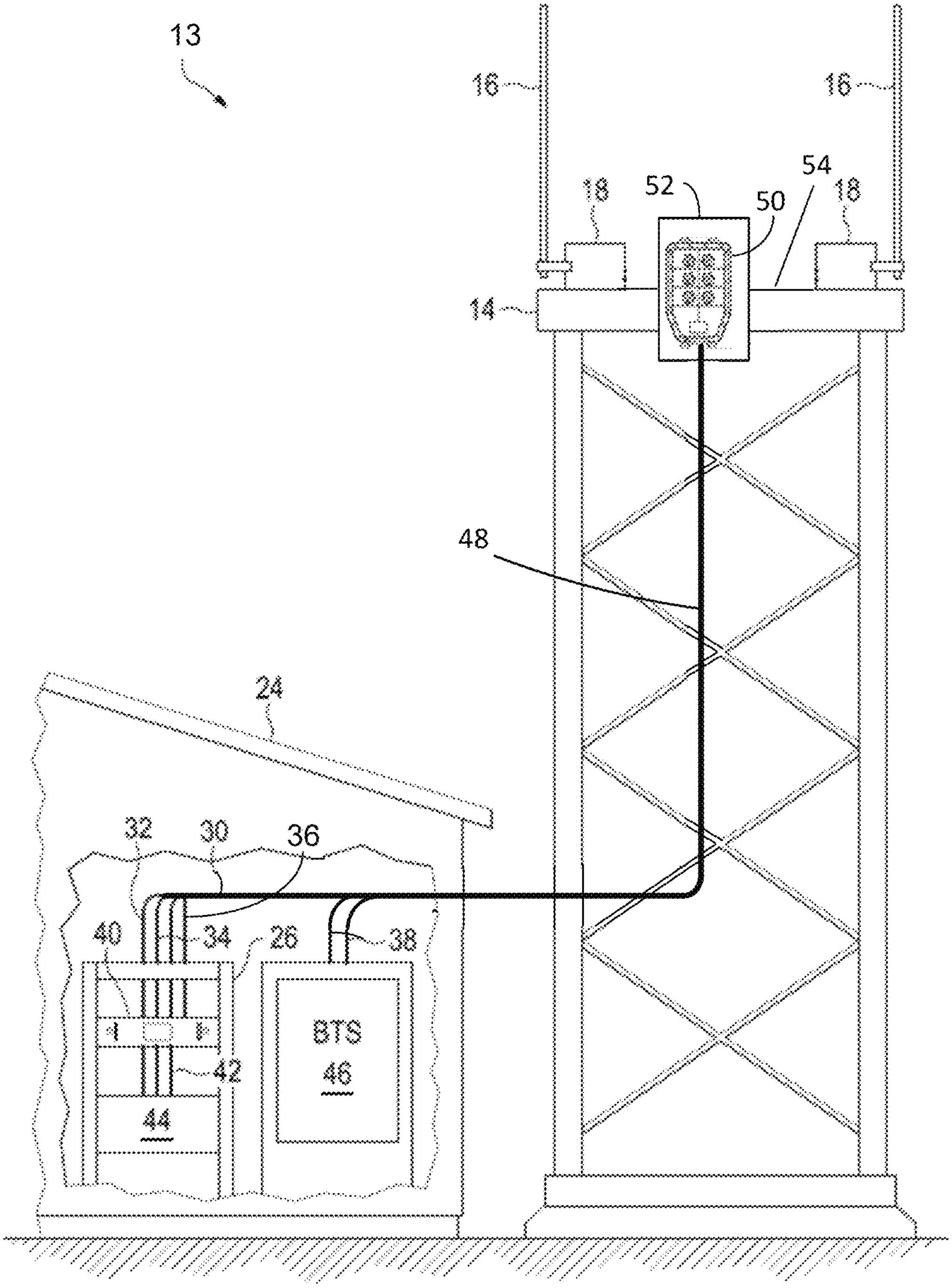
FIG. 1 illustrates a side view of a power communication system for a cellular tower installation, according to aspects of the present disclosure.

The disclosed embodiments relate to methods and systems for a modular distribution and signaling unit for fiber optic and power cables. The following description is presented to enable one of ordinary skill in the art to make and use the invention and is provided in the context of a patent application and its requirements. Various modifications to the exemplary embodiments and the generic principles and features described herein will be readily apparent. The disclosed embodiments are mainly described in terms of particular methods and systems provided in particular implementations. However, the methods and systems will operate effectively in other implementations. Phrases such as "one embodiment" and "another embodiment" may refer to the same or different embodiments. The embodiments will be described with respect to systems and/or devices having certain components. However, the systems and/or devices may include more or less components than those shown, and variations in the arrangement and type of the components may be made without departing from the scope of the invention. The disclosed embodiments will also be described in the context of particular methods having certain steps. However, the method and system operate effectively for other methods having different and/or additional steps and steps in different orders that are not inconsistent with the exemplary embodiments. Thus, the disclosed embodiments are not intended to be limited to the embodiments shown, but is to be accorded the widest scope consistent with the principles and features described herein.

The disclosed embodiments relate to a modular distribution and signaling (pendant) unit for fiber optic and power cables, which is installed at the top of cellular site towers to feed cellular radios. Embodiments of the present disclosure address the space issue of conventional cellular sites by providing a modular distribution and signaling unit that can distribute both power and data connections from a power and fiber cables (or from a hybrid cable containing both power and fiber) within a compact modular enclosure that helps reduce the overall footprint of the pendant unit mounted on a cellular tower. The distribution and signaling unit or device comprises an enclosure having walls forming an interior and an exterior and is installed on a trunk cable that feeds tower equipment, preferably at the factory of a trunk cable manufacturer, simplifying installation. Hybrid adaptors are arranged in an array in the interior and extend through one or more of the walls of the enclosure. The hybrid adaptors are further connected externally from the enclosure to cellular radios or remote radio heads (RRHs) on a tower. A plurality of pluggable overvoltage protection (OVP) modules are mounted to bus bars in the enclosure. In one embodiment the OVP modules are each mounted directly to one of one or more printed circuit board assemblies (PCBAs) PCBAs that are attached to bus bars. An optional pluggable PCBA module is also mounted in the enclosure to one of the bus bars to transmit alarm signals or to transmit voltage values measured from the power cables to a remote location. In one embodiment, the OVP modules and the PCBA module can be manually plugged into the enclosure without tools if necessary. All of these features are integrated within the distribution and signaling unit that is approximately 55%-70% smaller in form factor that conventional distribution units.

FIG. 1 illustrates a side view of a power communication system 13 for a cellular tower installation. The power communication system 13 may include a tower 14, a building 24, and a modular distribution signaling unit 50. The tower 14 may support multiple antennas 16 at the top of the tower 14. Radio units 18 may be positioned near the antennas 16. The modular distribution signaling unit 50 may be mounted on a support 52 at the top of the tower 14. Jumpers 54 may connect the modular distribution signaling unit 50 to the radio units 18.

The tower 14 may support multiple antennas 16 at the top of the tower 14. Radio units 18 may be positioned near the antennas 16. A distribution signaling unit 50 may be mounted on a support 52 at the top of the tower 14. Jumpers 54 may connect the distribution signaling unit 50 to the radio units 18.

A hybrid trunk cable 48 may run from the building 24 up the tower 14 to the distribution signaling unit 50. The hybrid trunk cable 48 may carry power and communication signals.

The building 24 may contain several components. A base suppression unit 40 may be included in the building 24. A rack 26 may house additional equipment. A power system 42 and a power plant 44 may be located within the rack 26. A base transceiver station 46 may also be present in the building 24.

Multiple cables may connect the building components to the tower equipment. DC power cables 30 may run from the power system 42 to the tower 14. In one example, DC power cables 30 include sets of −48 DC volt power cables 32, return power cables 34, and associated ground cables. In one example, power cables 30 and fiber optic cables 38 are run through a same hybrid trunk cable 48 that is routed out of building 24 and up tower 14 to a distribution and signaling unit 50 of the disclosed embodiments. A monitor cable 36 may connect the base suppression unit 40 to the tower equipment. Fiber optic cables 38 may provide data communication between the base transceiver station 46 and the tower equipment.

In some cases, the distribution signaling unit 50 may be pre-wired and terminated during factory assembly. This may allow for easier installation at the cellular tower site.

The power communication system 13 may integrate power supply, communication, and protective elements to support the cellular tower's operation. The distribution signaling unit 50 may serve as a central connection point for power and data signals at the top of the tower 14, facilitating efficient distribution to the radio units 18 and antennas 16.

Figure 2A:
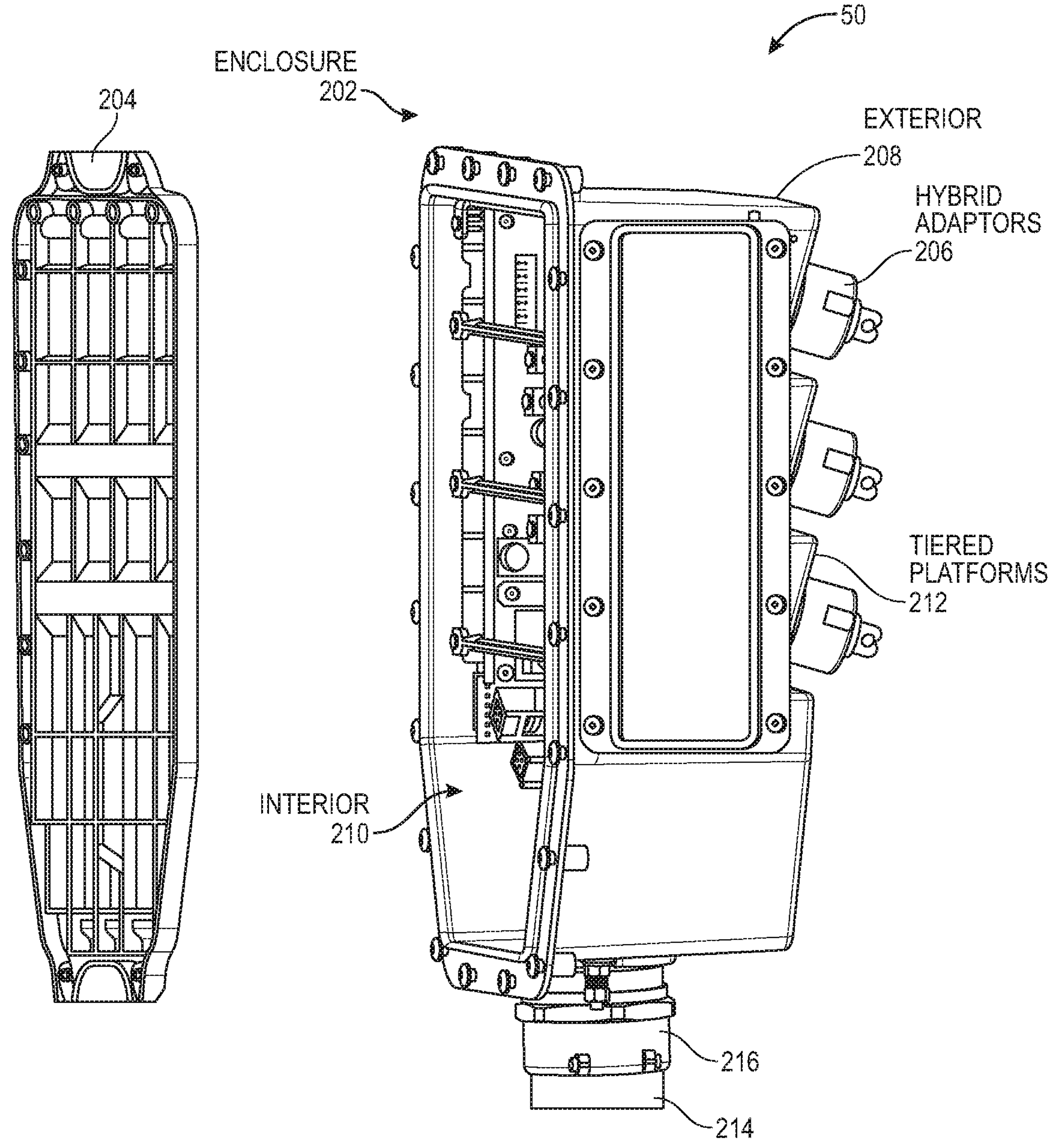

FIGS. 2A and 2B illustrate orthogonal views of the modular distribution signaling unit 50. FIG. 2A shows a side view of the modular distribution signaling unit 50, while FIG. 2B presents a front view.

The distribution signaling unit 50 may comprise an enclosure 202 having a removable dust cover 204 on one side and hybrid adaptors 206 extending out an exterior portion 208 on an opposite or back side. Removal of the dust cover 204 reveals an interior portion 210 of the enclosure 202, as shown in FIG. 2A. In this example, dust cover 204 may be coupled (e.g., using screws or nuts and bolts) around a perimeter of exterior portion 208 to enclose and protect the interior portion 210 of the enclosure 202. The dust cover 204 may also include (or be coupled to) support brackets (not shown) that allows the distribution and signaling unit 50 to be mounted on the tower 14.

As shown in FIGS. 2A and 2B, the hybrid adaptors 206 may be arranged in rows and columns and the exterior portion 208 includes a plurality of tiered angled platforms 212, with each platform configured to retain a row of the hybrid adaptors 206. In this example, three angled platforms 212 are shown, each with two hybrid adaptors 206 per tiered angled platform to 12, but alternative embodiments may include more or fewer platforms, and more or fewer hybrid adaptors 206 per platform. In this example, the plurality of tiered angled platforms 212 face diagonally downward to protect the hybrid adaptors 206 from weather and to assists an installer (usually standing below the distribution and signaling unit 50 on a ladder or other support) to connect or disconnect cabling to the hybrid adaptors 206.

The enclosure 202 may be tapered at the bottom such that the width of the bottom may be narrower than the overall width of the enclosure 202. This tapered design may allow for efficient use of space while providing necessary connections for the distribution signaling unit 50.

Due to the modular design of the distribution and signaling unit 50, the distribution and signaling unit is significantly smaller in size than previous units. For example, in some cases, the enclosure 202 may have dimensions of approximately 5.9"±1" in depth, 10.2"±1" in width, and 17.3"±1" in length. The enclosure 202 may include an exterior portion 208 and an interior portion 210.

The distribution and signaling unit is configured to connect to ends of one or more trunk cables 214. The trunk cable may comprise a hybrid cable that includes: i) one or more sets of power cables, ii) one or more fiber optic cables, and iii) one or more signaling cables. A cable entry and clamping mechanism 216 is disposed at the bottom of the enclosure 202 and is configured to receive the trunk cable(s) 214. In alternative embodiments, the cable entry and clamping mechanism 216 may be configured to receive separate power and data cables, such as a first trunk cable that includes one or more sets of power cables and a second trunk cable that includes one or more fiber optic cables. In one embodiment, no sealant is required inside the cable entry and clamping mechanism 216. The cable entry and clamping mechanism 216 may allow for both factory installation and field installation of the trunk cable(s) to distribution and signaling unit 50. For example, in some cases the distribution and signaling unit 50 may be pre-wired and terminated during factory assembly such that an installer is not required to make any cable connections in the field.

Figure 2C:
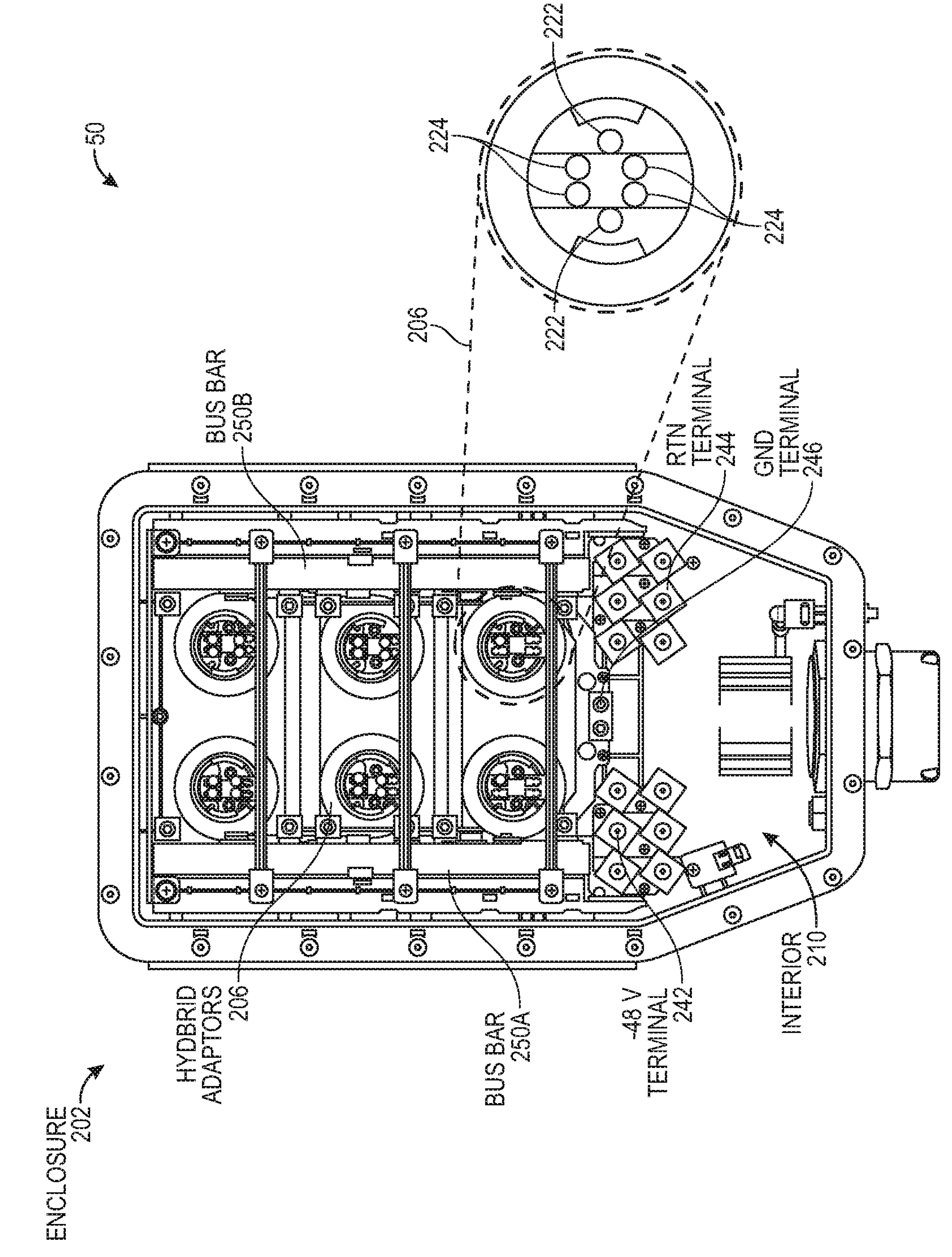
FIG. 2C illustrates a front view of the interior portion of a modular distribution signaling unit, according to some aspects of the present disclosure.

FIG. 2C illustrates a front view of the interior portion of a modular distribution signaling unit 50. Within interior portion 210 of the enclosure 202, multiple hybrid adaptors 206 are arranged in rows and columns, and bus bars 250 including first bus bar 250A and second bus bar 250B. The lower part of the enclosure 202 includes power terminals comprising a left and right −48 V terminals 242, left and right return (RTN) terminals 244, and a ground (GND) terminal 246. To optimize the cable routing and minimize the assembly and installation time, the power terminals (−48 V, RTN and GND) run widthwise partially across the enclosure. The power cables are connected to the −48 V terminals 242 and the RTN terminals 244.

The bus bars 250 are shown vertically oriented and positioned along the sides of the enclosure 202 on either side of the hybrid adaptors 206. The bus bars 250 may be mounted to one or more of the walls in the interior portion 210 of the enclosure 202 and are coupled to the −48 V terminals 242 and the RTN terminals 244.

FIG. 2C also includes a detailed view of one of the hybrid adaptors 206. The hybrid adaptors 206 provide connection points for both power and fiber optic cables. As such, each hybrid adaptor 206 includes power terminals 222 and fiber optic terminals 224.

Figure 2D:
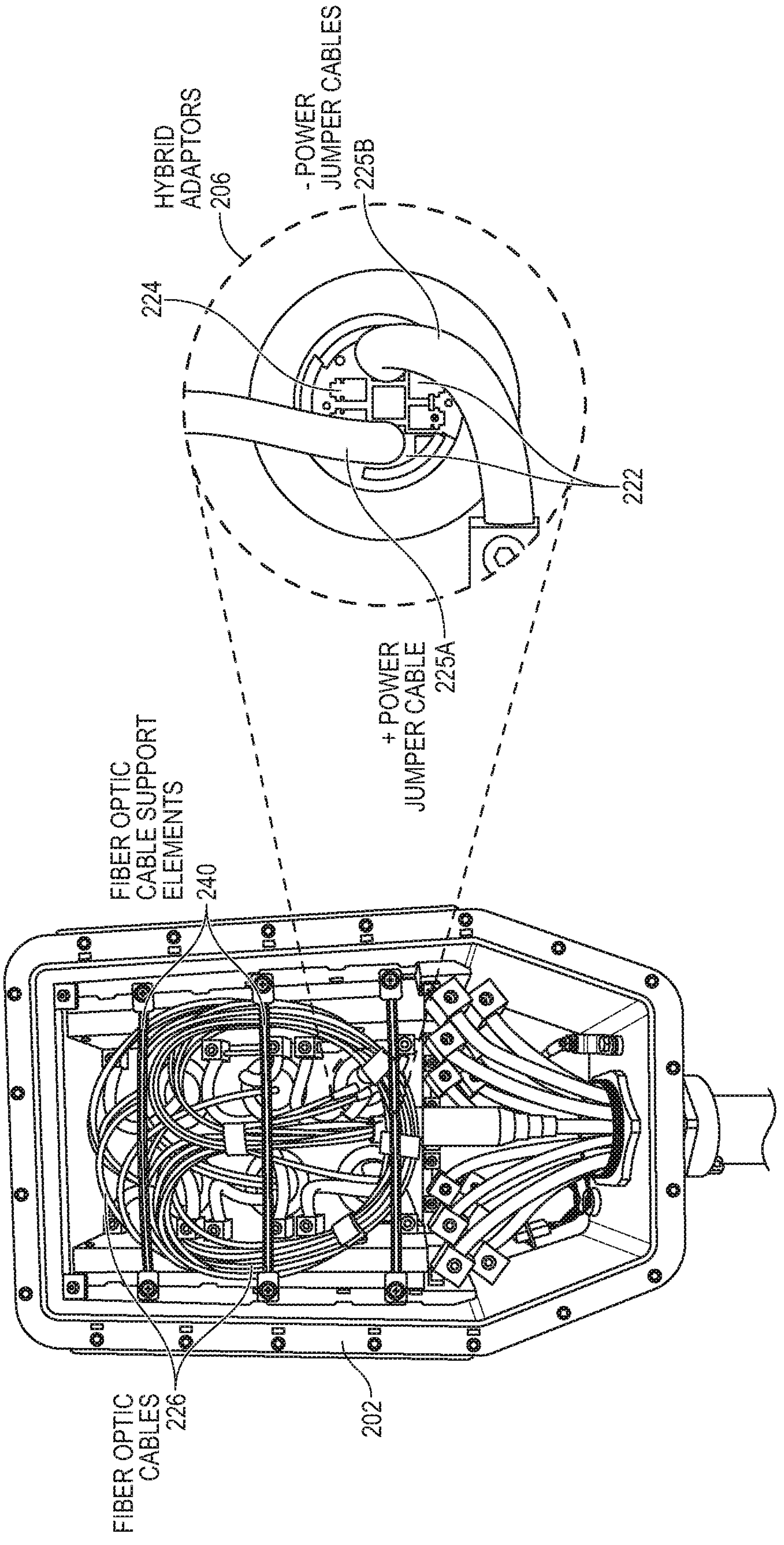
FIG. 2D illustrates an orthogonal view of the interior of an enclosure for a modular distribution signaling unit, in some implementations.

FIG. 2D illustrates an orthogonal view of the interior of the enclosure 202 for the modular distribution signaling unit 50, along with an arrangement of power cables and a detailed view of a hybrid adaptor 206. FIG. 2D shows that the fiber optic portion of the hybrid cable (or the fiber optic cable in case of separate power and fiber optic trunk cables) is routed through the interior portion of the enclosure 202. Fiber optic cables (along with power cables) enter through a bottom of the enclosure 202 and are routed through the middle of the enclosure to the various fiber terminals 224 of the hybrid adaptors 206 according to one embodiment.

In this example, three fiber optic cable support elements 240 are depicted running across the width of the enclosure, but in alternative embodiments, more or fewer support elements may be used, and the fiber optic cable support elements 240 may run in any suitable configuration (e.g., lengthwise) in the enclosure. Portions of the fiber optic cables 226 may be fastened to the support elements 240 using, for example, hook-and-loop fasteners coupled to the support elements 240. Additionally, the support elements 240 may be disposed between the fiber optic cables 226 and the removably attachable dust cover 204 to help protect the fiber optic cable against crimping or other damage during the assembly of the housing.

FIG. 2D further shows an enlarged view of one of the hybrid adapters 20. Each of the hybrid adaptors 206 further includes power terminals and a fiber terminal in an interior of the enclosure 202. For example, each of the hybrid adaptors 206 may include a pair of power terminals 222, corresponding to a −48 power terminal and a return power terminal. The hybrid adaptor 206 further includes fiber optic terminals 224. There are two pairs of fiber optic terminals 224 in this example, one pair for a top set of connectors and one for the pair for a bottom set of connectors.

Coupled to the power terminals 222 of each of the hybrid adaptors 206 is one end of a power jumper cable 225, while the other end of the power jumper cable 225 is coupled to one of the bus bars 250 adjacent to the hybrid adaptor 206. As shown, each power jumper cable comprises a positive power jumper cable 225A and a negative power jumper cable 225B. The power jumper cables 225A and 225B plug into the ends of power terminals 222. The fiber optic cables 226 plug into the fiber optic terminals 224. The power terminals 222 and fiber optic terminals 224 pass through an interior of the hybrid adaptors 206 to an exterior of the hybrid adaptors 206. Hybrid RRU jumper cables (not shown) connect to the power terminals 222 and fiber optic terminals 224 on the exterior of the hybrid adaptors 206 to couple the hybrid adaptors 206 to the RRHs. The hybrid RRU jumper cables may include supply power (−48) and return (RTN) power lines.

The arrangement of components within the enclosure 202 may allow for efficient management of both power and data connections in a compact space. The hybrid adaptors 206 may integrate power and fiber optic connections, while the cable support elements 240 may ensure proper organization and routing of the fiber optic cables 226 throughout the enclosure 202.

Figure 3A:
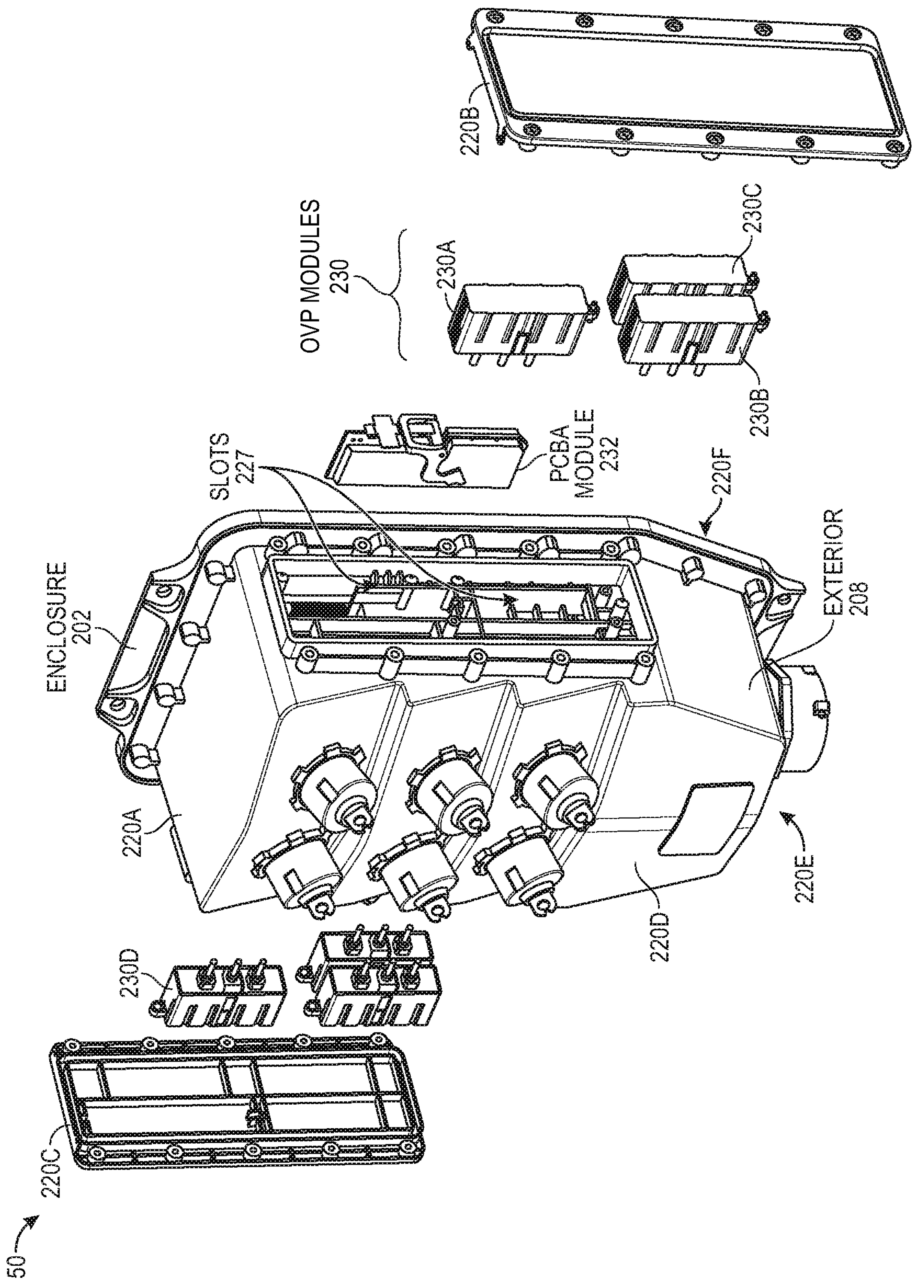
FIG. 3A illustrates an exploded isometric view of a modular distribution signaling unit, according to some aspects of the present disclosure.

FIG. 3A illustrates an exploded isometric view of the modular distribution signaling unit 50 in accordance with the disclosed embodiments. The modular distribution signaling unit 50 comprises enclosure 202 with an exterior portion 208 that includes a top wall 220A, side walls 220B and 220C, a front wall 220D, a bottom wall 220E, and a rear wall 220F (i.e., dust cover 204).

Unlike prior units, the distribution and signaling unit 50 of the disclosed embodiments is modular with pluggable OVP modules 230 that can be installed on either side of the housing without requiring special tools. Up to six OVP modules 230 can be added even after the unit is mounted on the tower, without the need for disassembly. In addition, at least one pluggable PCBA module 232 for monitoring alarms and voltages can also be plugged in from the side of the enclosure 202.

Both the OVP modules 230 and the PCBA module 232 are inserted by an operator into respective slots 227 within the enclosure 202. Thus, both the OVP modules 230 and the PCBA module 232 are removably docked in the slots 227 from the exterior the enclosure 202. According to the disclosed embodiments, both the OVP modules 230 and the PCBA module 232 are detachable and replaceable (plug & play) from the enclosure 202 without interrupting any connection of the incoming power and fiber cables.

The slots 227 may be accessible by removal of one or more cover panels, e.g., side walls 220B and 220C, on the exterior portion 208 of the enclosure 202. This accessibility may facilitate maintenance and replacement of the OVP modules 230 and the PCBA module 232 without requiring disassembly of the entire modular distribution signaling unit 50.

The PCBA module 232 is shown as a separate optional unit that may also be inserted into one of the slots 227 in the enclosure 202. The PCBA module 232 includes a processor, microcontroller, or ASIC (not shown) that may be configured to initiate and transmit alarm signals or voltage values measured from the power cables to a remote location, such as the base suppression unit 40 in the building 24. The processor may be also configured to receive voltage values measured by circuitry that monitors DC voltages input to the RRHs, and to transmit the voltage values to the base through a communication protocol such as RS485, for example. In addition, the PCBA module 232 may include a suite of one or more sensors and monitoring logic to identify different alarm and voltage conditions. For example, the monitoring logic may detect a failure of the OVP modules 230 within distribution and signaling unit 50, detect intrusion into the distribution and signaling unit 50, detect water infiltration within the distribution and signaling unit 50, and/or detect voltage levels within distribution and signaling unit 50 or as output to the RRHs.

The processor may detect water intrusion through the use of moisture sensors strategically placed within the distribution and signaling unit 50. In some implementations, these sensors may be connected to the PCBA module 232 and may trigger an alarm signal when water is detected. Additionally, the processor may monitor changes in electrical conductivity or resistance between specific points within the enclosure 202, as the presence of water may alter these electrical properties.

The PCBA module 232 may also generate messages indicating failures of OVP modules 230, voltage levels on the power cables, wiring anomalies, or any other power disruption. The PCBA processor may send intrusion or water ingress messages based on activation of an intrusion switch (not shown) or activation of a water detection switch (not shown). The PCBA module 232 may use a RS485 communication link with 2 twisted pair (+ground) wires, Ethernet, or a wireless module, to communicate voltage, up-converter system, and alarm data to base suppression unit 40 in FIG. 1. In some implementations, the processor may package the voltage data and alarm information into standardized protocols or custom data formats before transmission. Firmware operating in the CPU on PCBA module 232 can be updated through the RS485 connection.

To measure voltage values from the power cables, the processor in the PCBA module 232 may utilize various techniques. PCB wires (not shown) from the PCBAs 228 connect DC voltages on OVP modules 230 to the PCBA module 232. The voltages may be tied together using diodes to create a common bus to voltmeter (VM) and alarm (ALM) circuitry on to the PCBA module 232. The voltages may be also connected to precision resistor divider networks and transient-voltage-suppression (TVS) protection in OVP modules 230 and may be measured with an analog-to-digital converter (ADC). The processor may periodically sample the ADC outputs to obtain digital representations of the voltage levels. The processor may apply calibration factors stored in non-volatile memory to compensate for component tolerances and improve measurement accuracy. In certain implementations, the processor may employ oversampling and averaging techniques to reduce noise and improve the resolution of the voltage measurements. In some cases, the processor may be programmed to perform real-time analysis of the measured voltage values. This analysis may include comparing the voltages against predefined thresholds, detecting rapid voltage fluctuations, or calculating power quality metrics. The processor may generate alarm signals based on this analysis, which can be transmitted to the remote location along with the raw or processed voltage measurements.

Figure 3B:
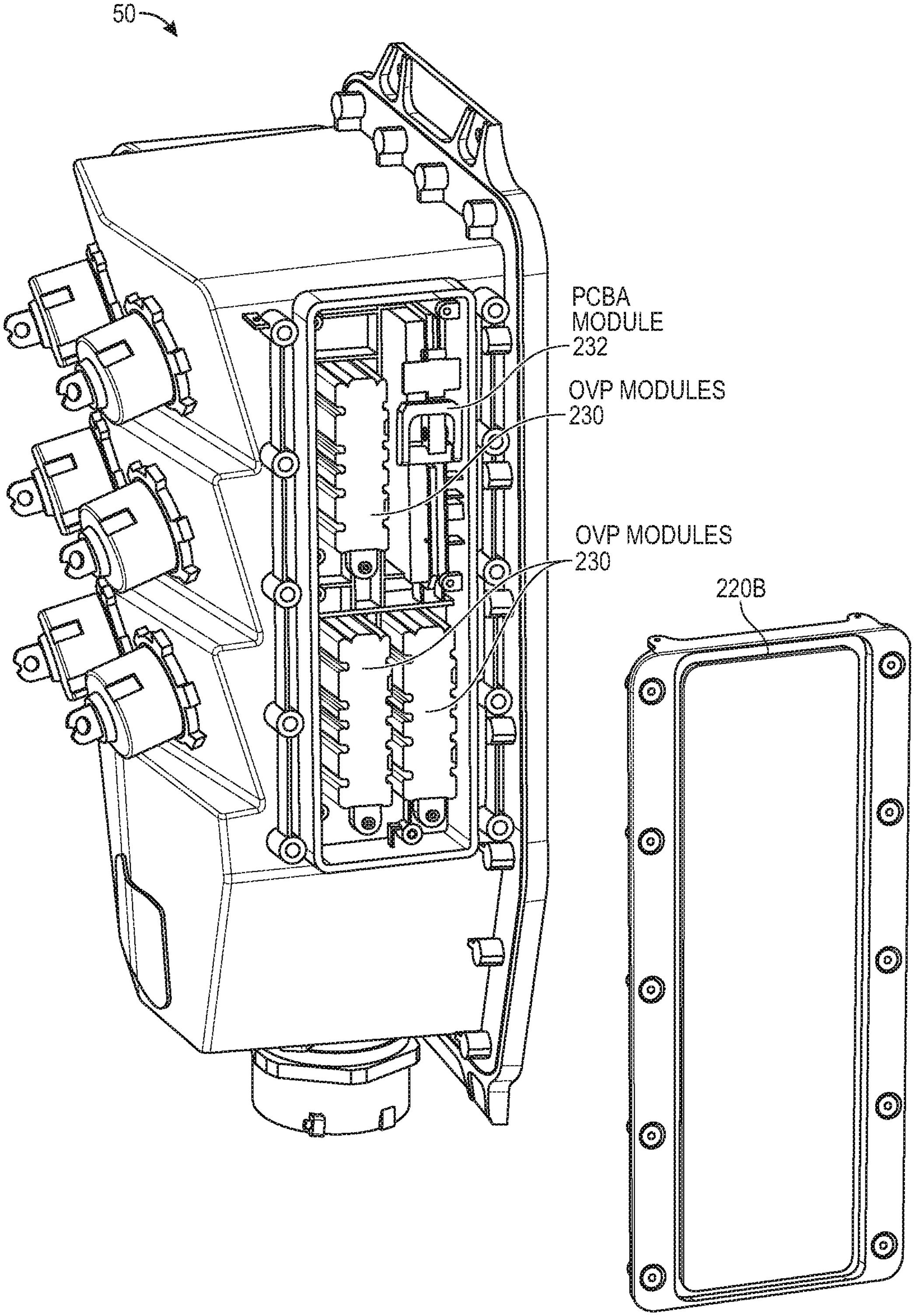
FIG. 3B illustrates a perspective view of a modular distribution signaling unit, in certain embodiments.

FIG. 3B illustrates a perspective view of the modular distribution signaling unit 50 showing the OVP modules 230 and the PCBA module 232 plugged in and installed inside the enclosure 202 prior to attachment of side wall 220B.

Referring to both FIGS. 3A and 3B, in some cases the modular distribution signaling unit 50 is manufactured or formed with the enclosure 202 having a plurality of the slots 227 in one or more sides of the enclosure 202. The enclosure may include one or more removable side walls over the slots. In some aspects, the modular distribution signaling unit 50 is manufactured or formed by locating one or more bus bars 250 in proximity to respective columns or rows of hybrid adaptors 206.

Before or after installation on the tower, an operator may remove one of the side walls and removably insert one or more OVP modules 230 and optionally the PCBA module 232 into respective slots 227 such that the OVP modules 230 and the PCBA module 232 are physically and electrically connected to bus bars 250. In some cases, up to three OVP modules 230 and one PCBA module 232 may be arranged vertically along one side of the enclosure 202, e.g., as a 2×2 array. In some cases, the PCBA module 232 may be positioned at the top of the modular distribution signaling unit 50 with one adjacent OVP module and two OVP modules 230 below. The opposite side of the enclosure 202 may accommodate up to three other OVP modules 230. After installation, the side walls 220A and 220B may be reaffixed to the side of the enclosure 202.

Figure 3C:
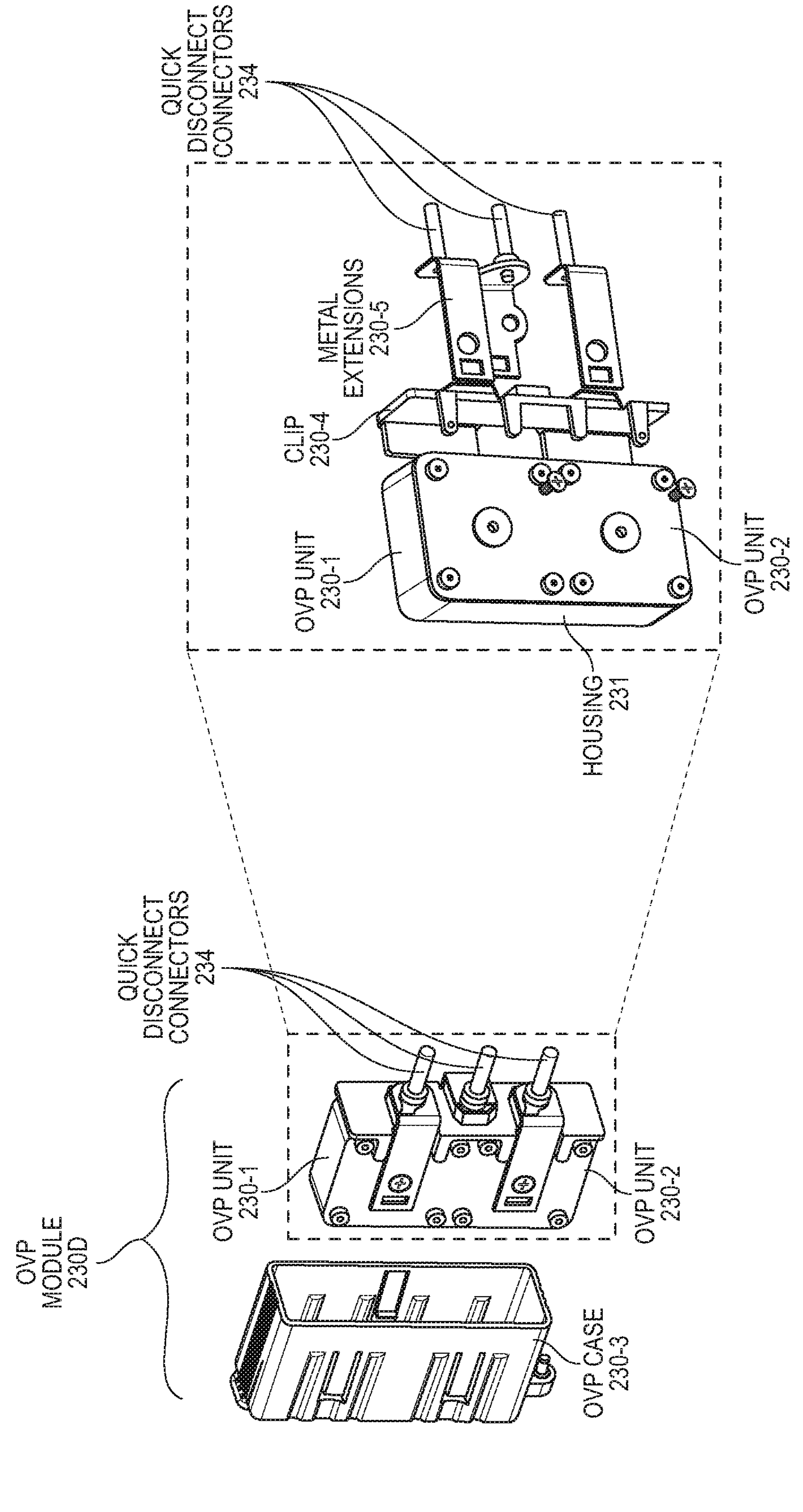
FIG. 3C illustrates a perspective view of one of the OVP modules showing an internal structure of the OVP modules.

FIG. 3C illustrates a perspective view of one of the OVP modules 230 showing an internal structure of the OVP modules 230. In this example, OVP module 230D is shown, but the description may apply to all the OVP modules 230. An enlarged view of the OVP module 230D is also shown.

Externally, OVP module 230D is covered by an OVP case 230-3. The OVP case 230-3 may comprise a plastic insulating material, PVC, or the like, to provide electric insulation and prevent a user from touching live parts during plugging in and unplugging the OVP module 230. Further, the OVP case 230-3 may prevent accidental short-circuiting of power lines in the trunk cable 214 during operation.

Internally, OVP module 230D includes two integrated OVP (over voltage protection) units, OVP unit 230-1 and OVP unit 230-2, both housed within the OVP case 230-3. The OVP units 230-1 and 230-2 are devices designed to protect electrical systems from damage caused by voltage spikes or surges. In some aspects, the OVP units may function by diverting excess voltage to ground when the voltage exceeds a predetermined threshold, thereby safeguarding sensitive equipment (Radios) connected to the distribution signaling unit.

OVP module 230D includes a housing 231 enclosing OVP unit 230-1 and OVP unit 230-2 on at least four of six sides. In one embodiment, the housing may comprise a metal material. OVP module 230D also includes three terminals in the form of quick disconnect connectors 234, such as pins or bullet connectors. In some cases the terminals can also be in the form of a blade or other shape that will allow connection in a pluggable manner. The quick disconnect connectors 234 may be able to carry surge currents of very high di/dt, which generate high forces when they conduct surge current and might deform the pins or push the OVP modules 230 out of the bus bars 250. Therefore, it is important for the terminals to have good connections that will secure their position.

The quick disconnect connectors 234 may be coupled to OVP units 230-1 and 230-2 through a clip 230-4 and metal extensions 230-5 that fasten to at least one side of the OVP units 230-1 and 230-2. The quick disconnect connectors 234 facilitate the connection of the OVP modules 230 to the bus bars 250 within the enclosure 202.

In addition, the quick disconnect connectors 234, such as bullet connectors, allow the OVP modules 230 and the PCBA module 232 to be inserted and plugged in to establish electrical connections without the need for tools. The tool-less installation process for the OVP modules 230 and the PCBA module 232 may involve aligning the modules with the corresponding slots 227 in the enclosure 202 and inserting them until secure.

Figure 3D:
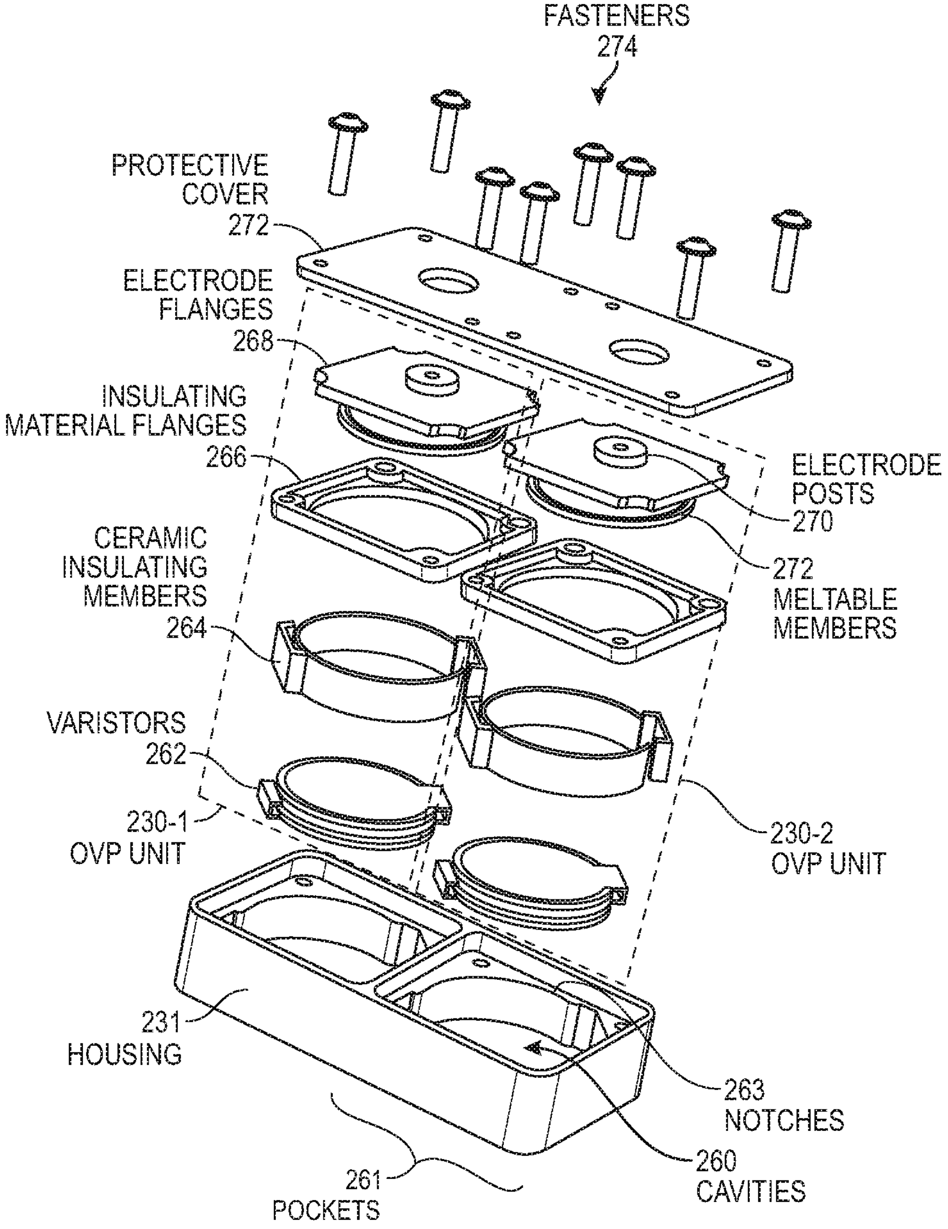
FIG. 3D is an exploded view of the internal structure of housing that contains two OVP units.

FIG. 3D is an exploded view of the internal structure of the housing 231 containing OVP units 230-1 and 230-2. The housing 231 of the OVP modules 230 may be divided into one or more pockets 261 having cavities 260 therein that host the OVP units 230-1 and 230-2, respectively. Tops of each of the cavities 260 includes a flat notches 263 with one side of a disk-shaped varistor 262 disposed thereon. The notches 263 are formed from material between the square shape of the pockets 261 and the circular shape of the cavities 260. The sides of the two varistors 262 are surrounded by respective circular insulating members 264. In one embodiment, circular insulating members 264 comprise a ceramic material. The diameter of the circular insulating member 264 is sized to fit between sides of the respective varistors 262 and interior walls of the cavities 260 to insulate the varistors 262 from the housing 231.

Insulating material flanges 266 are disposed over respective ceramic insulating members 264 and sit on top of notches 263 within an interior of the house at 231. In an alternative embodiment, insulating material flanges 266 may be a singular unit rather than two units. In one embodiment, insulated material flanges 266 may comprise silicon or the like. As shown, the insulated material flanges 266 have an exterior shape (e.g., square) matching the shape of an interior of pockets 261, and an interior shape (e.g., circular) matching the shape of the circular insulating members 264.

Electrode flanges 268 are disposed within the insulated material flanges 266 over the respective varistors. Electrode flanges 268 are generally square in shape and have electrode post 270 extending out of one side, and a meltable member 272 disposed on an opposite side. Meltable members 272 comprise a low melting metal alloy having a melting point between 130° C. and 200° C. with very low Ohmic resistance. Meltable members 272 have a generally circular shape that fits within the insulated material flanges 266.

The electrode posts 270 extend outside the cavities 260 to allow connection to a power line via quick connect connectors. The electrodes 264 may connect to one side of the disk-shaped varistor 262, with the other side of the varistor 262 disposed on the flat notches 263 of the cavity 260. This arrangement allows the electrode posts 270 to provide an electrical path between the varistor 262 and external power connections, while extending outside the cavity 260 to facilitate installation and replacement if needed.

OVP units 230-1 and 230-2 are covered by a protective cover 272, which may comprise an insulating material (e.g., such as used in PCBs) to keep the internal parts of the cavities 260 in place under pressure. The protective cover 272 is secured to housing 231 using mounting screws 274 that pass through pre-formed holes in the protective cover 274.

In operation, the meltable members 272 that surround the posts 270 are responsive to temperature and when there is a temperature rise, one or both of the meltable members 272 melt onto the varistors 262, connecting the OVP units 230-1 and 230-2 to the housing 231, by-passing the varistors 262. The OVP modules 230 can develop increased temperatures (above the melting point of the meltable member) in case of any abnormal overvoltage conditions where the voltage will be above the maximum continuous operating voltage of the varistors 262 and the OVP module, which will force some leakage current to be conducted through the varistors 262 and generate heat. Further, in case of lightning currents above the specified maximum level that the OVP units can withstand, the varistors 262 may fail. The varistors 262 fails in a low ohmic resistance value and current from the power source will be conducted. That will lead to the overheating of the module and the by-pass of the varistors 262.

The by-pass mechanism is used to generate a short circuit of very low resistance and prevent further overheating of the OVP modules 230, under the follow current flow (in case of varistor failure) or in case of leakage current flow for a long duration. When in a by-pass mode, an upstream fuse or circuit breaker may disconnect the OVP modules 230 from the power system. Therefore, the OVP module with the described design has a safe end of life mode of operation.

The modular design of the modular distribution signaling unit 50 may allow for easy installation, removal, and replacement of the OVP modules 230 and the PCBA module 232 for maintenance or upgrades. The modular design of the modular distribution signaling unit 50 may also allow for customization based on specific requirements. In some cases, the number of OVP modules 230 installed may be adjusted according to the power protection needs of the cellular tower installation. For example, PCBA module 232 may or may not be installed based on whether monitoring and communication functions are required. The ability to install and remove the OVP modules 230 and the PCBA module 232 without tools may facilitate quick maintenance and upgrades in the field. In some cases, this design may allow for replacement of individual modules without affecting the entire system, minimizing downtime during maintenance operations.

Although the components can be installed without the use of tools, for added protection, the components may be optionally secured with one or more fasteners (not shown), such as screws, bolts, clips, pins, rivets, or snap-fit connectors. In some aspects, the fasteners may be selected based on the specific requirements of the installation environment. In some cases, quick-release fasteners may be employed to facilitate rapid access for maintenance while still providing secure attachment.

Figure 3E:
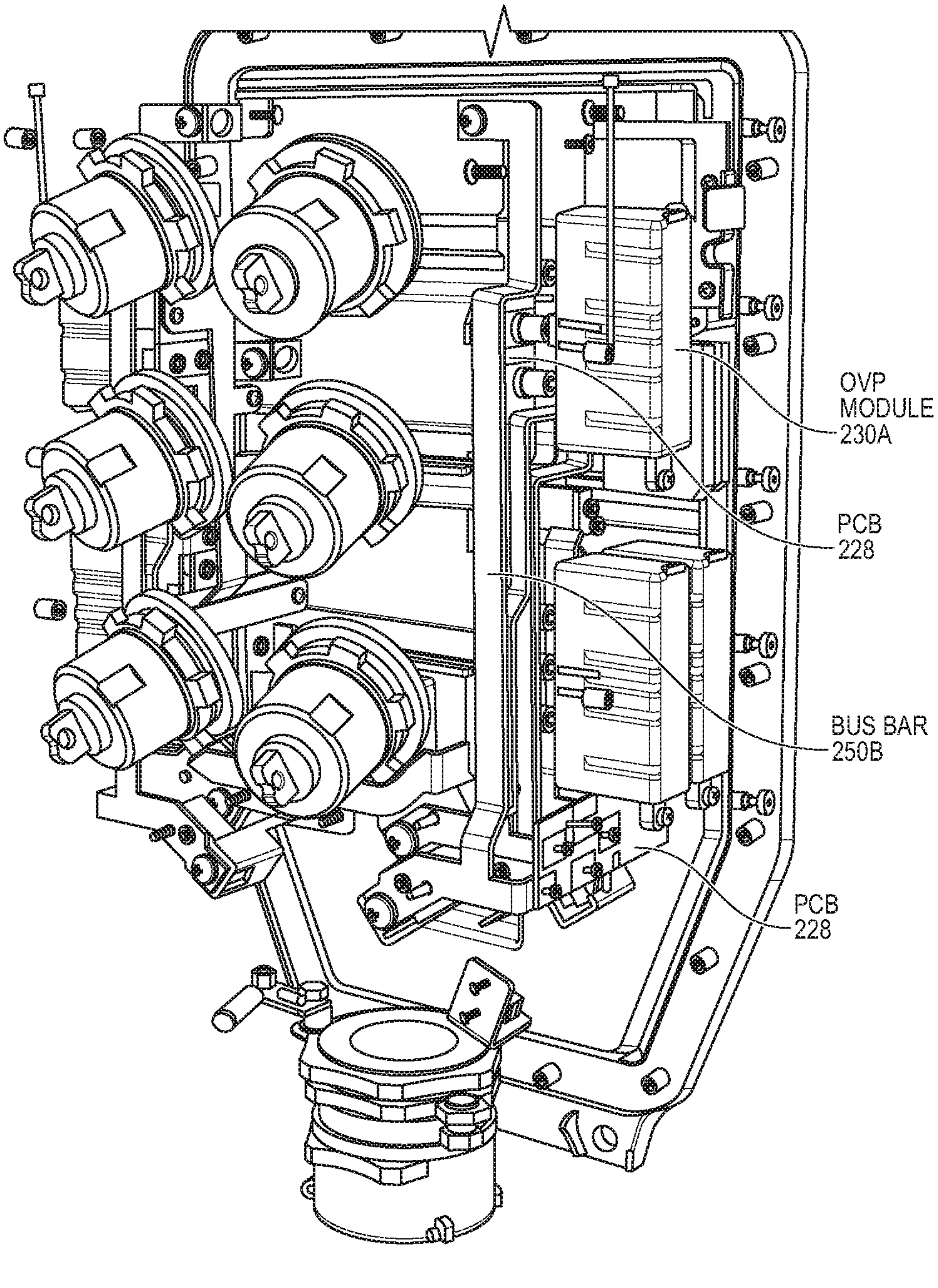
FIG. 3E illustrates a perspective view of a modular distribution and signaling unit with the enclosure removed, according to some aspects of the present disclosure.
Figure 4A:
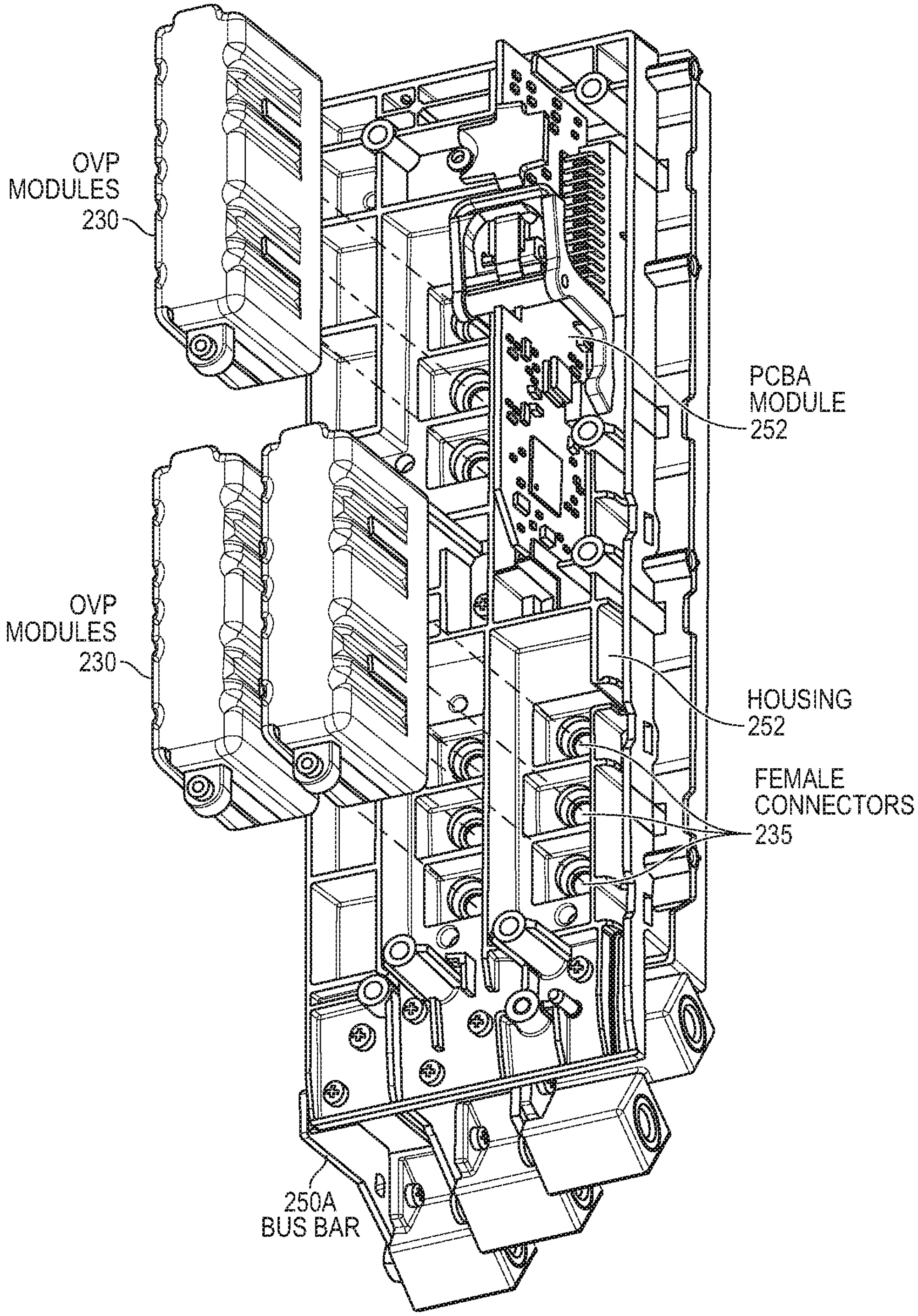
FIG. 4A and FIG. 4B illustrate angled views of a bus bar and OVP modules, in some implementations.

FIG. 3E illustrates a perspective view of the internal arrangement of the modular distribution signaling unit 50. The figure shows the arrangement of the OVP modules 230 and their connection to the bus bars 250 within the enclosure 202 without a housing 252 (FIG. 4A). Only bus bar 250B is visible in this view, but the description applies also to bus bar 250A.

In some cases, the OVP modules 230 may be arranged in a vertical array within the enclosure 202 adjacent to one or more sides of the enclosure 202. In this view only three of the six OVP modules 230 are visible, with the first OVP module 230A shown at the top of the unit. Each of the OVP modules 230 may be vertically positioned and removably inserted into the slots 227 of the enclosure 202.

Bus bars 250 are shown as vertical conductive elements that run vertically near the sides of the interior of enclosure 202 adjacent to a side of the OVP modules 230 containing the bullet connectors 234.

In one aspect, the OVP modules 230 are directly connected to bus bars 250, which are connected to the −48 V terminals 242 and the RTN terminals 244. Jumper cables 225 (FIG. 2D) then connect to the OVP modules 230 to the hybrid adaptors 206 to, in effect, terminate the power cables at the hybrid adaptors 206. The fiber optic cables 226 are terminated directly at the hybrid adaptors 206, as explained above in FIG. 2D.

The coupling between the OVP modules 230 and the bus bars 250 is achieved through electrical connectors on the OVP modules 230 that mate with corresponding connectors on the bus bars 250. In one implementation, the electrical connectors comprise bullet connectors 234.

According to one embodiment, the bus bars 250 may include one or more printed circuit boards (PCBs) 228 that provide support and electrical connections for the OVP modules 230. In some cases, the OVP modules 230 may include three male bullet connectors 234 that mate with three female bullet connectors on the PCBs 228. The bullet connectors 234 may facilitate the removable insertion of the OVP modules 230 into the slots 227 while ensuring proper electrical contact. Two PCBs 228 are visible in FIG. 3C, one at the top and one at the bottom of the bus bar 250B. The PCBs 228 may serve as an interface between the OVP modules 230 and the bus bar 250B. In some cases, the PCBs 228 may include conductive traces that route electrical signals between the OVP modules 230 and the bus bar 250B.

Accordingly, the bus bars 250 provide electrical connectivity between the OVP modules 230 and other components of the modular distribution signaling unit 50. Through the connection with the bus bar 250B, the OVP modules 230 provide voltage protection and facilitate power distribution and grounding for the hybrid adaptors 206. This arrangement may allow for efficient power distribution and signal routing within the modular distribution signaling unit 50.

The modular distribution and signaling unit 50 may be sized and dimensioned to effectively route power and data cabling, as described above. However, the design of the modular distribution and signaling unit 50 provides this functionality in a relatively smaller footprint compared to conventional distribution units to achieve minimal footprint on the tower 14. Referring again to FIGS. 2A and 2B, in some embodiments, the size of the distribution and signaling unit 50 may be less than 10 mm in width and less than 20 inches in length. In one specific example shown in FIG. 2A, the exterior portion of the distribution and signaling unit 50 may be 5.9"±1" D×10.2±1" W×17.3"±1" L (with the enclosure 202). This is in contrast with prior units that were relatively large by comparison. For example, Patent U.S. Pat. No. 10,971,928, herein incorporated by reference, may describe a similar device, but at a significantly larger size with dimensions of 11.4" D×15.7" W×19.4" L. And application U.S. Pat. No. 20,210,91481 A1 (EP3798706A1) herein incorporated by reference, may refer to a similar in size pendant unit, but that unit has minimum functionality since there is no voltage monitoring and no alarm detection or signaling. Both of these devices are not modular and do not utilize pluggable OVP modules or include a removable PCBA module.

Figure 4B:
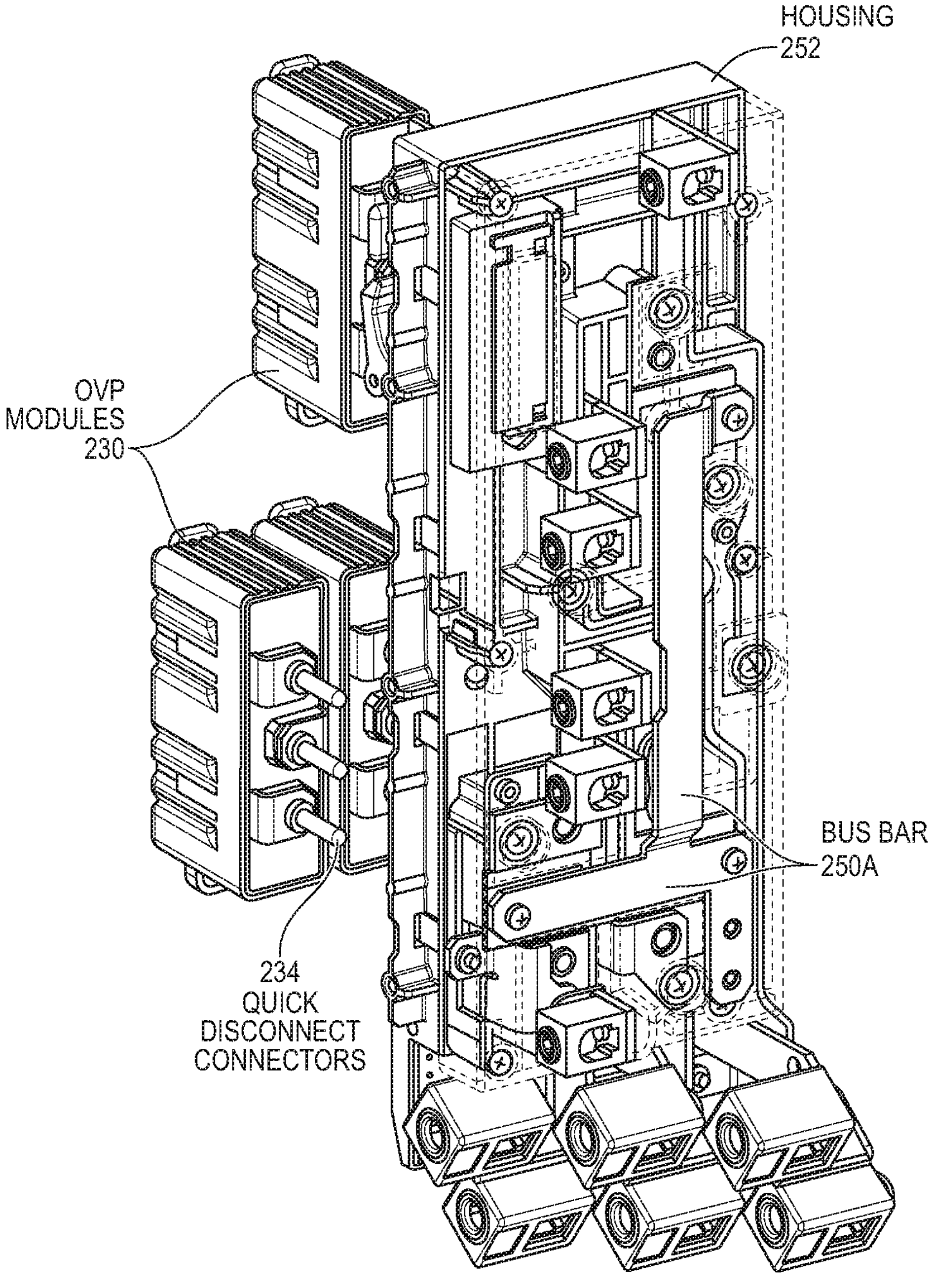

FIGS. 4A-4B illustrate perspective views of the internal components of the bus bars 250, including a housing 252.

FIG. 4A shows a front view of bus bar 250A disposed within housing 252, while FIG. 4B shows a rear view of bus bar 250A disposed within housing 252. The housing 252 contains bus bar 250A, PCBs 228 shown in FIG. 3C, and up to four sets of female connectors 235 disposed on the PCBs 228. Multiple OVP modules 230 are shown on one side of housing 252 ready for insertion into female connectors 235. PCBA module 232 is shown positioned at the top right of bus bar 250A and plugged into female connectors 235 on housing 252 of the bus bar 250A.

FIG. 4B is a view showing the quick disconnect connectors 234 on the OVP modules 230, which mate with the female bullet connectors 235. The bus bar 250A ensures direct connection between −48V terminal 242 and return terminal 244 where the trunk cable 214 is terminated and. Further, the bus bar 250A serves to provide connections to −48V terminal 242 and return terminal 244 for the pluggable OVP modules 230 as well as additional mechanical support for the associated terminals. Finally, it offers a very compact way to conduct the load current from the trunk cable 214 to the hybrid adaptors, as the flat shape of bus bar 250A maximizes heat dissipation. The flat shape of bus bar 250A reduces the size of bus bar 250A, and at the same time, the flat shape allows a very compact design to fit all the bus bar connections inside the housing 252.

While quick disconnect connectors 234 and female connectors 235 are shown, alternative electrical quick-disconnect connector types may be used in some cases. For example, the quick-disconnect connectors 234 may also include blade-style connectors, pin-and-socket connectors, spring-loaded connectors, and the like. The choice of quick-disconnect connector type may depend on factors such as the required current capacity, environmental conditions, and ease of installation.

The use of quick-disconnect connectors 234, such as bullet connectors may offer several benefits for the modular design of the modular distribution signaling unit 50. In some cases, this connection method may allow for quick and tool-less installation or removal of the OVP modules 230. Quick-disconnect connectors 234 may provide a reliable electrical connection that can withstand the environmental conditions typically encountered in cellular tower installations. In some cases, the modular design facilitated by the quick-disconnect connectors 234 may allow for easy maintenance and replacement of individual OVP modules 230 without affecting the entire system. This may reduce downtime during maintenance operations and allow for flexible configuration of the modular distribution signaling unit 50 based on specific power protection requirements.

Figure 5A:
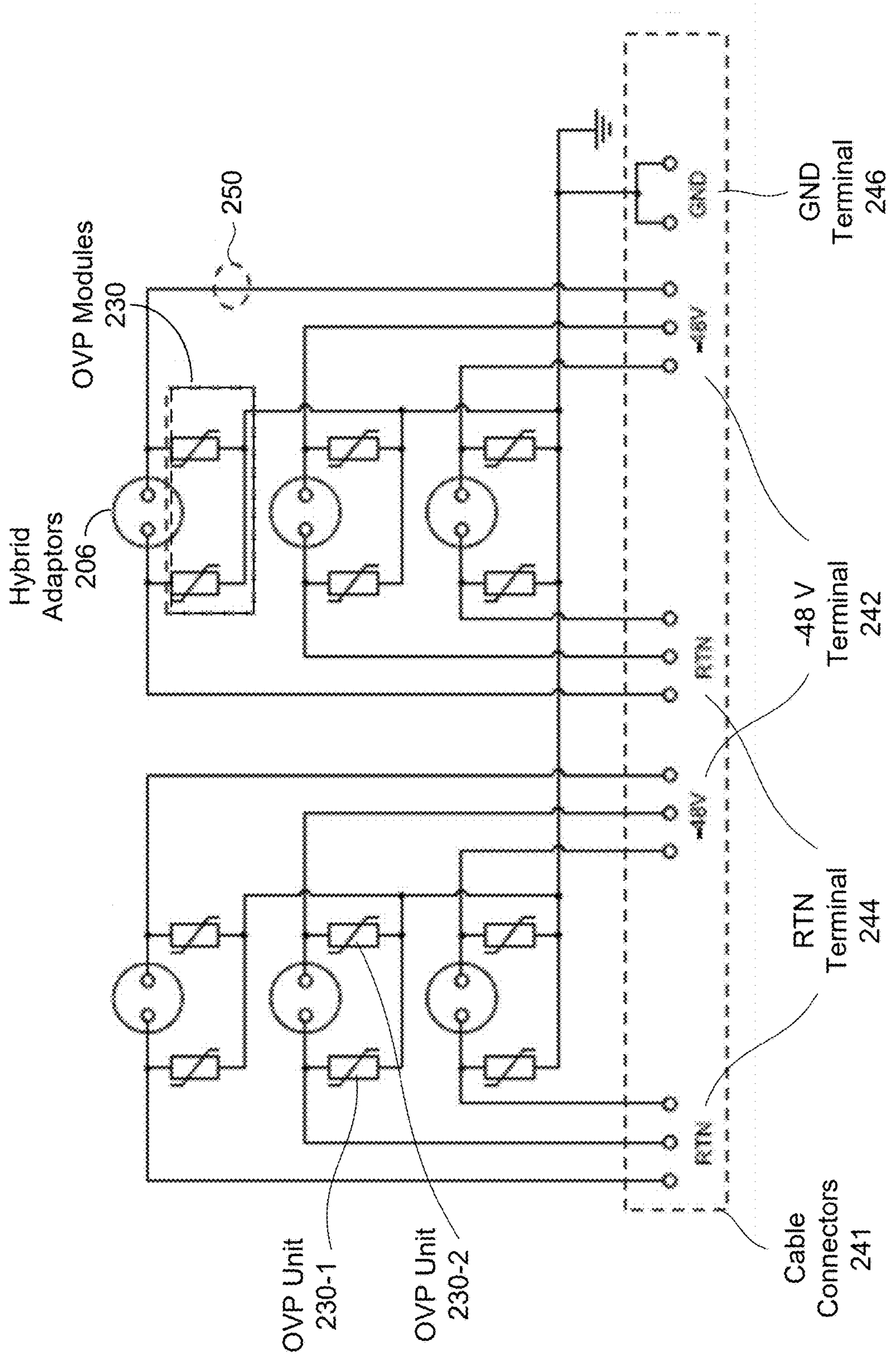
FIGS. 5A and 5B illustrate circuit diagrams of a modular distribution and signaling unit with overvoltage protection, in certain embodiments.

FIG. 5A illustrates a circuit diagram of the electrical configuration within the modular distribution signaling unit 50. The circuit diagram shows the connections between the hybrid adaptors 206, the OVP modules 230, and various power terminals.

In some cases, the circuit may include multiple hybrid adaptors 206 arranged in one or more columns. Each of the hybrid adaptors 206 may be connected to one of the OVP modules 230. The OVP modules 230 may comprise two OVP units: OVP unit 230-1 and OVP unit 230-2. These OVP units may be connected in series between the hybrid adaptors 206 and cable connectors 241.

Cable connectors 241 may include three power terminals: the return (RTN) terminal 244, the input power (−48V) terminal 242, and the ground (GND) terminal 246. In some cases, the RTN terminal 244 and the −48V terminal 242 may each be connected to separate columns of the OVP modules 230, while the GND terminal 246 may be connected to both columns. Dashed circles indicate bus bars 250, which facilitate the electrical connection between the OVP modules 230 and the cable connectors 241. The bus bars are connected to −48V terminal 242 and RTN terminal 244.

FIG. 5A shows one example embodiment where the OVP modules 230 are installed between −48V terminal 242 to GND terminal 246, and between RTN terminal 244 to GND terminal 246.

Figure 5B:
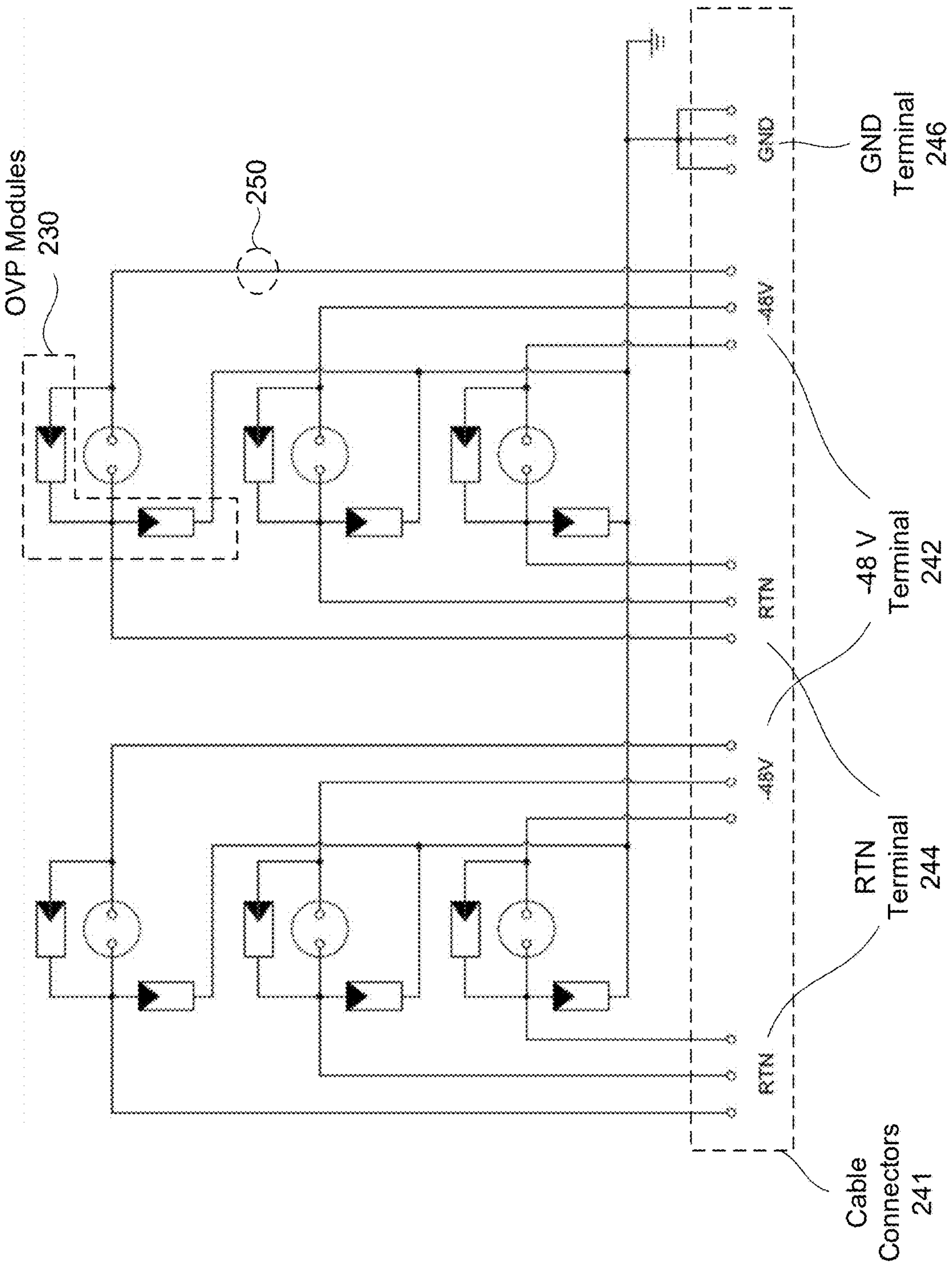

FIG. 5B shows another example embodiment where the OVP modules 230 are installed between −48V terminal 242 to RTN terminal 244, and between RTN terminal 244 to GND terminal 246.

The circuit configuration may allow for overvoltage protection on both the return and power lines. When power flows through the circuit, the power may pass through the OVP modules 230, which may protect against voltage surges before reaching the hybrid adaptors 206 to reduce potential electrical damage. The PCBA module 232 is also connected to the bus bars 250, although this connection is not explicitly shown in FIG. 5A.

The electrical circuit configuration illustrated in FIG. 5A may demonstrate the integration of power distribution and overvoltage protection within the compact design of the modular distribution signaling unit 50. The use of the bus bars 250 may allow for efficient power routing and modular connection of the OVP modules 230, contributing to the overall flexibility and maintainability of the system.

Figure 5C:
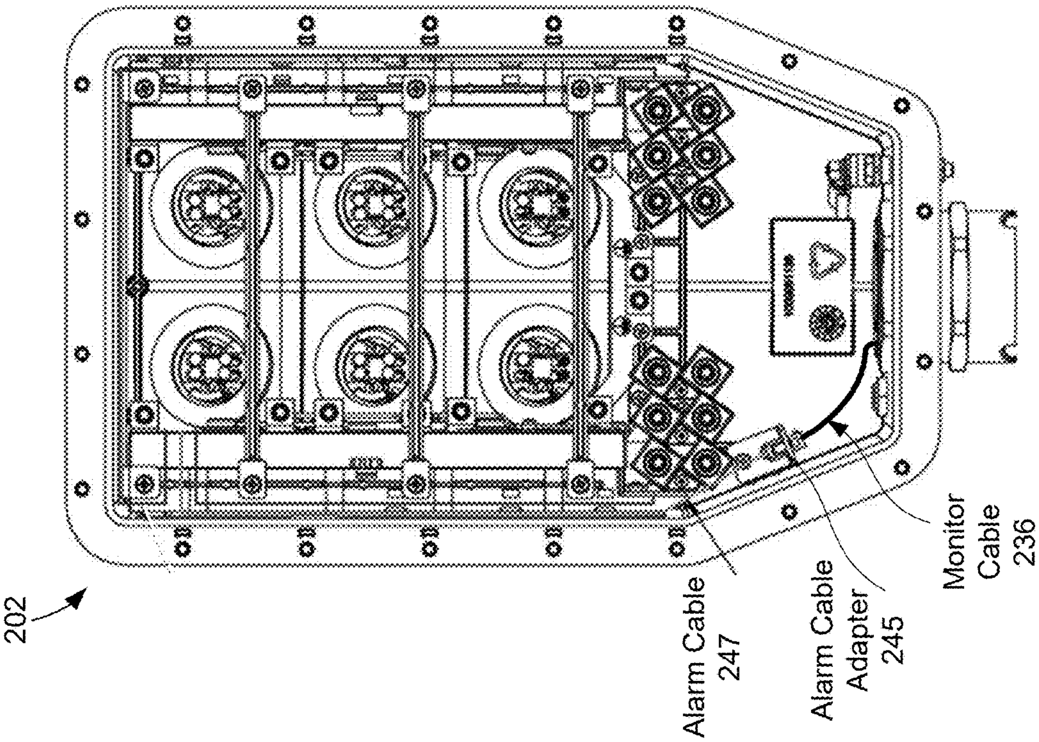
FIG. 5C illustrates an orthogonal front view of a modular distribution signaling unit, according to some aspects of the present disclosure.

FIG. 5C illustrates an orthogonal front view of the modular distribution signaling unit 50, showing the alarm and monitoring connections within the enclosure 202. The enclosure 202 may house various components for power distribution and communication.

In some cases, a monitor cable 236 may enter the enclosure 202 from the bottom, such as through the cable entry mechanism 216. The monitor cable 236 may provide a connection for monitoring functions of the modular distribution signaling unit 50. In some aspects, one end of the monitor cable 236 may connect to the base suppression unit 40 located in building 24. The other end of the monitor cable 236 may terminate at alarm cable adapter 245, which may be located at the bottom of the enclosure 202. The alarm cable adapter 245 may serve as a connection point for external alarm and monitoring systems.

An alarm cable 247 may be connected to the alarm cable adapter 245 and may route upwards along a side of the enclosure 202. The alarm cable 247 may terminate at internal components within the modular distribution signaling unit 50, such as the PCBA module 232.

The PCBA module 232 may include sensors and monitoring logic to identify different alarm and voltage conditions within the modular distribution signaling unit 50. In some cases, the PCBA module 232 may include a processor (not shown) configured to transmit alarm signals or voltage values measured from the power cables to a remote location, such as the base suppression unit 40. In some cases, the processor of the PCBA module 232 may be configured to detect failures of the OVP modules 230, intrusion into the enclosure 202, water infiltration within the enclosure 202, or voltage levels within the enclosure 202.

The PCBA module 232 may use an RS485 communication link with twisted pair wires to communicate data to the remote location. In some cases, the PCBA module 232 may alternatively use wireless communication, such as WiFi, cellular, or Bluetooth, to transmit data to the remote location.

The alarm cable 247 and monitor cable 236 may facilitate the transmission of alarm signals, voltage measurements, and other monitoring data from the modular distribution signaling unit 50 to external monitoring systems. This configuration may allow for remote monitoring and management of the modular distribution signaling unit 50, enhancing the overall reliability and maintenance capabilities of the power communication system 13.

Figure 6:
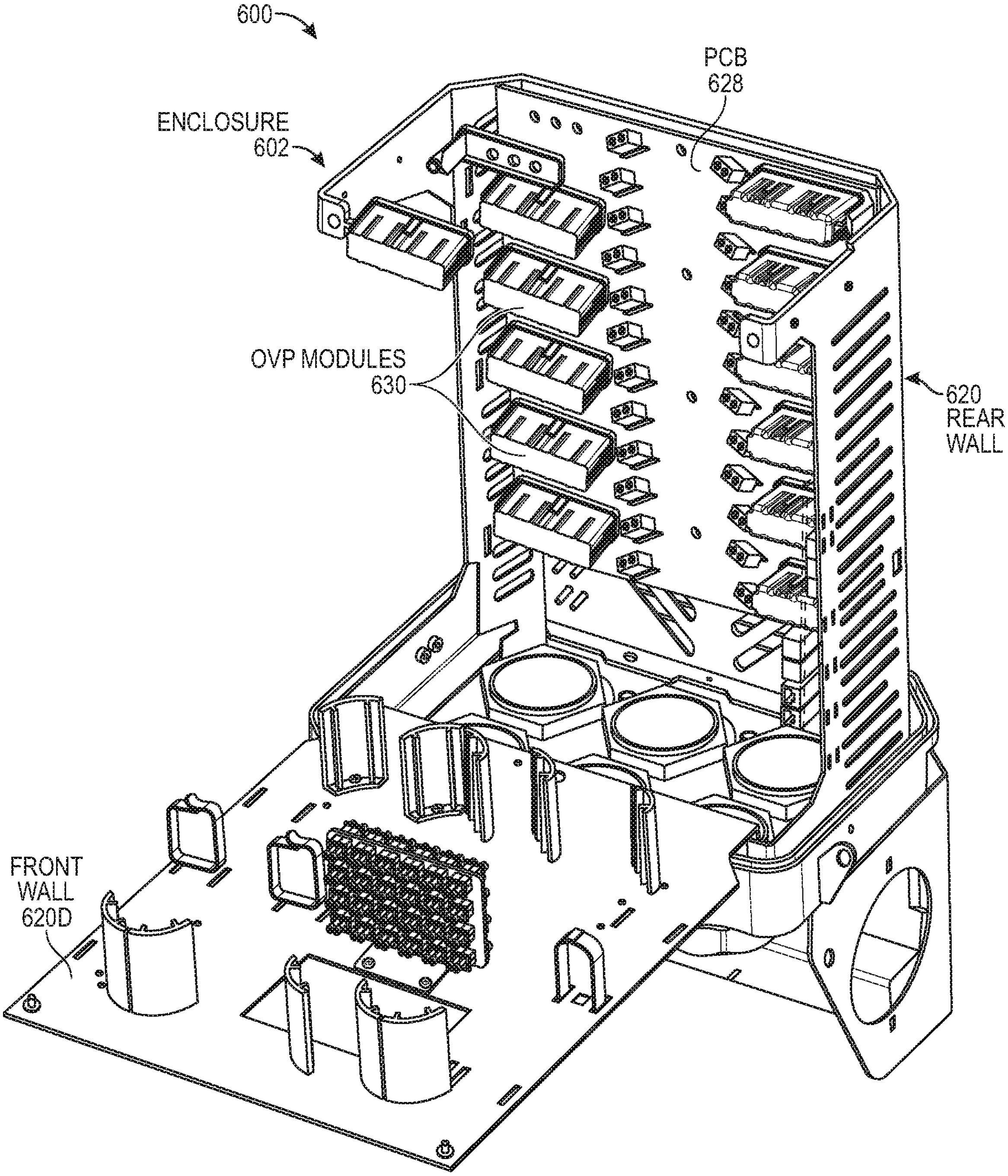
FIG. 6 illustrates an alternative embodiment of a modular rooftop or towertop unit having a pluggable architecture.

FIG. 6 illustrates a perspective view of another embodiment of the distribution and signaling unit referred to herein as a modular power distribution unit (PDU). The PDU 600 comprises a housing enclosure 602 that provides structural support and protection for internal components. Similar to the modular distribution signaling unit 50, the housing enclosure 602 includes a plurality of walls. However, different from modular distribution signaling unit 50, in this embodiment front wall 620D opens outwardly and a rear wall 620 is fixed. As shown, front wall 620D may be configured to open outwardly from a bottom edge based on a hinge design.

An open front wall 620 reveals a circuit board 628 (e.g. a PCB) is mounted on an interior surface of rear wall 620, providing electrical connections and support for other components. In one embodiment, circuit board 628 may be substantially the same size (+−20%) as the rear wall 620F.

Multiple pluggable OVP modules 630 are plugged into the circuit board 628 via quick connect connectors (not shown in this view). The OVP modules 630 are disposed on the circuit board 628 in a column configuration, allowing for modular installation and removal. Although not shown in this view, one or more PCBA modules may also be plugged into the circuit board 628.

Additionally, one or more sides of the housing enclosure 602 may include ventilation slots to facilitate air circulation for cooling the internal components. The bottom portion of the housing enclosure 602 may include mounting points and connection interfaces for external power cables and power distribution.

Alternative Embodiments

In some aspects, the distribution signaling unit may incorporate alternative power distribution configurations. For example, the unit may be adapted to accommodate different voltage levels, such as +24V or −60V, to suit various cellular tower power requirements. The bus bars may be modified to handle higher current capacities, potentially allowing for expanded power distribution capabilities.

In certain implementations, the enclosure of the distribution signaling unit may be constructed from different materials. For instance, a lightweight composite material may be used to reduce the overall weight of the unit, potentially facilitating easier installation and maintenance on cellular towers. Alternatively, a high-strength alloy may be employed to enhance the unit's durability in extreme weather conditions.

The OVP modules may, in some cases, incorporate advanced surge protection technologies. For example, the modules may utilize gas discharge tubes or metal oxide varistors in combination with solid-state components to provide multi-stage protection against various types of voltage surges and transients.

In some embodiments, the PCBA module may include additional functionality. For instance, it may incorporate a local display for on-site diagnostics, allowing technicians to quickly assess the status of the distribution signaling unit without the need for external equipment. The PCBA module may also include expanded memory capabilities for logging historical data on power quality and surge events.

The hybrid adaptors may, in certain implementations, be designed to accommodate different types of fiber optic connectors, such as SC, LC, or MPO connectors. This flexibility may allow the distribution signaling unit to be compatible with a wider range of existing cellular tower infrastructure.

In some aspects, the distribution signaling unit may incorporate a modular cooling system. For example, thermoelectric coolers or miniature fans may be integrated into the enclosure to manage internal temperatures in hot climates, potentially extending the lifespan of the electronic components.

The alarm and monitoring system may, in some implementations, be expanded to include additional sensors. For instance, accelerometers may be incorporated to detect and report physical impacts or vibrations that could potentially damage the unit. Temperature and humidity sensors may also be included to provide more comprehensive environmental monitoring.

In certain embodiments, the distribution signaling unit may incorporate renewable energy integration capabilities. For example, the unit may include inputs for connecting to solar panels or wind turbines, potentially allowing for hybrid power operation in remote locations or during grid power outages.

The modular design of the distribution signaling unit may, in some cases, be extended to allow for field-upgradable features. For instance, the unit may include expansion slots for adding new functionality, such as 5G signal boosting or edge computing capabilities, without requiring a full replacement of the existing infrastructure.

A number of implementations have been described. Nevertheless, it will be understood that various modifications may be made without departing from the spirit and scope of the disclosure. Accordingly, other implementations are within the scope of the following claims.

The invention claimed is:

1. A distribution and signaling unit, comprising:

an enclosure configured to receive a trunk cable comprising power cables and fiber optic cables;

hybrid adaptors arranged in an array and extending through one or more walls of the enclosure;

a plurality of pluggable over voltage protection (OVP) modules removably inserted into the enclosure; and a pluggable printed circuit board assembly (PCBA) module removably inserted into the enclosure, the PCBA module including a processor configured to transmit alarm signals or voltage values measured from the power cables to a remote location.

2. The distribution and signaling unit of claim 1, wherein the plurality of pluggable OVP modules and the pluggable PCBA module are removably inserted into slots in one or more sides of the enclosure without use of tools.

3. The distribution and signaling unit of claim 2, wherein the slots are accessible by removal of one or more cover panels on an exterior of the enclosure.

4. The distribution and signaling unit of claim 1, further comprising one or more bus bars located in proximity to respective columns or rows of the hybrid adaptors, wherein the plurality of pluggable OVP modules and the pluggable PCBA module are coupled to the one or more bus bars.

5. The distribution and signaling unit of claim 4, wherein the plurality of pluggable OVP modules and the pluggable PCBA module include quick-disconnect connectors for coupling to the one or more bus bars.

6. The distribution and signaling unit of claim 4, further comprising power jumper cables coupled between power terminals of the hybrid adaptors and the one or more bus bars.

7. The distribution and signaling unit of claim 1, wherein the processor of the pluggable PCBA module is further configured to detect failures of the pluggable OVP modules, water infiltration within the enclosure, or voltage levels within the enclosure.

8. The distribution and signaling unit of claim 1, wherein ones of the plurality of pluggable OVP modules comprise:

a housing enclosing a first OVP unit and a second OVP unit, wherein the housing comprises:

one or more cavities;

a varistor disposed in one of the cavities; and an electrode flange is over each varistor and extends outside the cavity.

9. The distribution and signaling unit of claim 8, wherein the housing further comprises:

a circular insulating member surrounding sides of each varistor; and an insulating material flange disposed over each circular insulating member;

wherein the electrode flange is disposed within the insulating material flange, the electrode flange having an electrode post extending from one side and a meltable member disposed on an opposite side.

10. A method of manufacturing a distribution and signaling unit, comprising:

forming an enclosure configured to receive a trunk cable comprising power cables and fiber optic cables;

providing hybrid adaptors arranged in an array and extending through one or more walls of the enclosure;

inserting a plurality of pluggable over voltage protection (OVP) modules into respective slots in the enclosure; and inserting a pluggable printed circuit board assembly (PCBA) module into a slot in the enclosure, the PCBA module including a processor configured to transmit alarm signals or voltage values measured from the power cables to a remote location.

11. The method of claim 10, further comprising locating one or more bus bars in proximity to respective columns or rows of the hybrid adaptors, wherein the plurality of pluggable OVP modules and the pluggable PCBA module are coupled to the one or more bus bars.

12. The method of claim 11, wherein coupling the plurality of pluggable OVP modules and the pluggable PCBA module to the one or more bus bars comprises connecting quick connect connectors on the modules to corresponding connectors on the bus bars.

13. The method of claim 11, further comprising coupling power jumper cables between power terminals of the hybrid adaptors and the one or more bus bars.

14. The method of claim 10, wherein inserting the plurality of pluggable OVP modules and the pluggable PCBA module comprises inserting the modules into slots in one or more sides of the enclosure without use of tools.

15. The method of claim 14, further comprising providing removable cover panels on an exterior of the enclosure to allow access to the slots.

16. The method of claim 10, wherein the processor of the pluggable PCBA module is further configured to detect failures of the pluggable OVP modules, water infiltration within the enclosure, or voltage levels within the enclosure.

17. A modular distribution and signaling system for a cellular tower, comprising:

an enclosure configured to receive a trunk cable comprising power cables and fiber optic cables;

hybrid adaptors arranged in an array and extending through one or more walls of the enclosure;

one or more bus bars located in proximity to respective columns or rows of the hybrid adaptors;

a plurality of pluggable over voltage protection (OVP) modules removably inserted into the enclosure and electrically coupled to the one or more bus bars; and a pluggable printed circuit board assembly (PCBA) module removably inserted into the enclosure and electrically coupled to at least one of the one or more bus bars, the PCBA module including a processor configured to transmit alarm signals or voltage values measured from the power cables to a remote location.

18. The modular distribution and signaling system of claim 17, wherein the plurality of pluggable OVP modules and the pluggable PCBA module are removably inserted into slots in one or more sides of the enclosure without use of tools.

19. The modular distribution and signaling system of claim 18, wherein the slots are accessible by removal of one or more cover panels on an exterior of the enclosure.

20. The modular distribution and signaling system of claim 17, wherein the plurality of pluggable OVP modules and the pluggable PCBA module include quick- disconnect connectors for coupling to the one or more bus bars.

21. The modular distribution and signaling system of claim 17, further comprising power jumper cables coupled between power terminals of the hybrid adaptors and the one or more bus bars.

22. The modular distribution and signaling system of claim 17, wherein the processor of the pluggable PCBA module is further configured to detect failures of the pluggable OVP modules, water infiltration within the enclosure, or voltage levels within the enclosure.

* * * * *